(12) United States Patent
Ikeda

(10) Patent No.: US 6,335,244 B1
(45) Date of Patent: Jan. 1, 2002

(54) METHOD FOR PRODUCING NONVOLATILE SEMICONDUCTOR MEMORY DEVICE

(75) Inventor: Osamu Ikeda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/523,176

(22) Filed: Mar. 10, 2000

(30) Foreign Application Priority Data

Mar. 12, 1999  (JP) ............................................ 11-067441

(51) Int. Cl.$^7$ ............................................ H01L 21/336
(52) U.S. Cl. ........................ 438/257; 438/258; 438/263; 438/266; 438/279
(58) Field of Search ................................. 438/257, 258, 438/261, 262, 263, 264, 265, 266, 267, 275, 279

(56) References Cited

U.S. PATENT DOCUMENTS 5,326,999 A * 7/1994 Kim et al. ................... 257/321
5,846,861 A    12/1998 Saitoh
6,268,247 B1 * 7/2001 Cremonesi et al. ......... 438/258

* cited by examiner

Primary Examiner—Charles Bowers
Assistant Examiner—Jack Chen
(74) Attorney, Agent, or Firm—Oblon, Spivak, McClelland, Maier & Neustadt, P.C.

(57) ABSTRACT

A second polysilicon layer (218) and an ONO insulator film (216) are etched using mask insulator films (220a and 220b) as masks to form a control gate (218a), a second gate electrode (218b) and intergate insulator films (216a and 216b). Then, a resist mask (224) for a first gate electrode (214b) is formed in a peripheral transistor forming region or a selecting transistor forming region. Subsequently, a first polysilicon layer (214) is etched using the resist mask and the mask insulating films (220a and 220b) as masks to form a floating gate (214a) and a first gate electrode (214b). Thus, the mask insulator film (220b) has no difference in level, so that the surface of an interlayer insulator film (228) can be flattened.

8 Claims, 16 Drawing Sheets

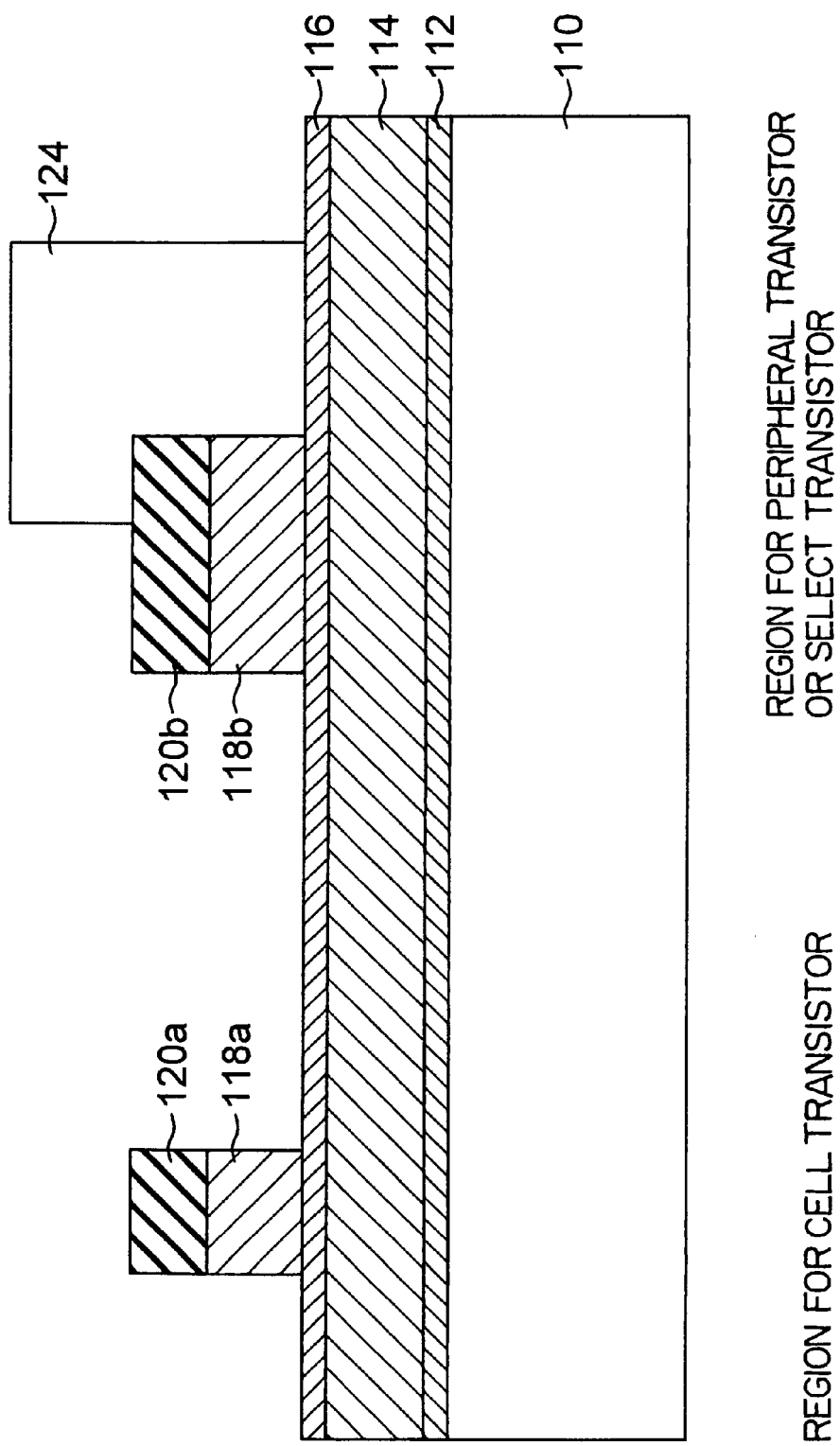
F I G. 3

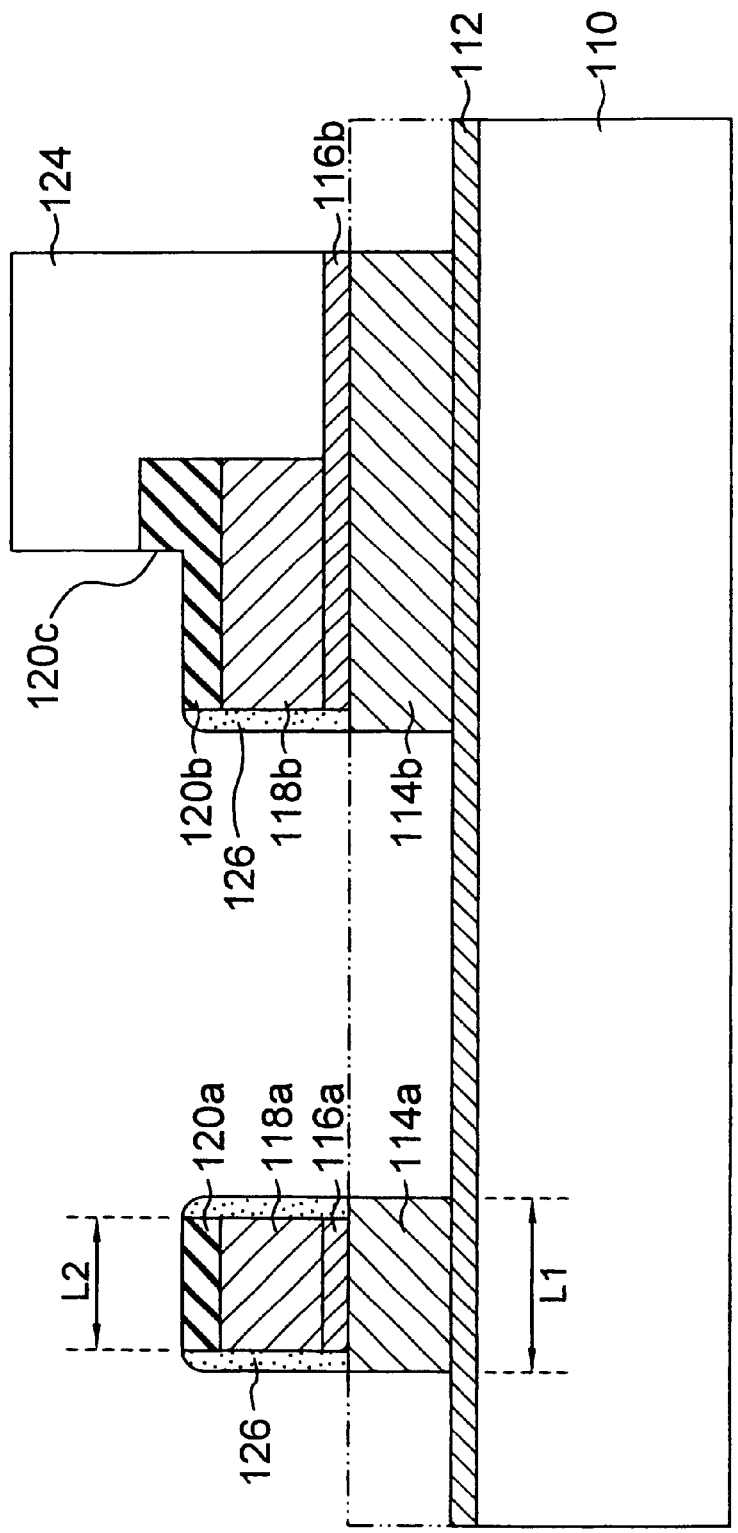
F I G. 5

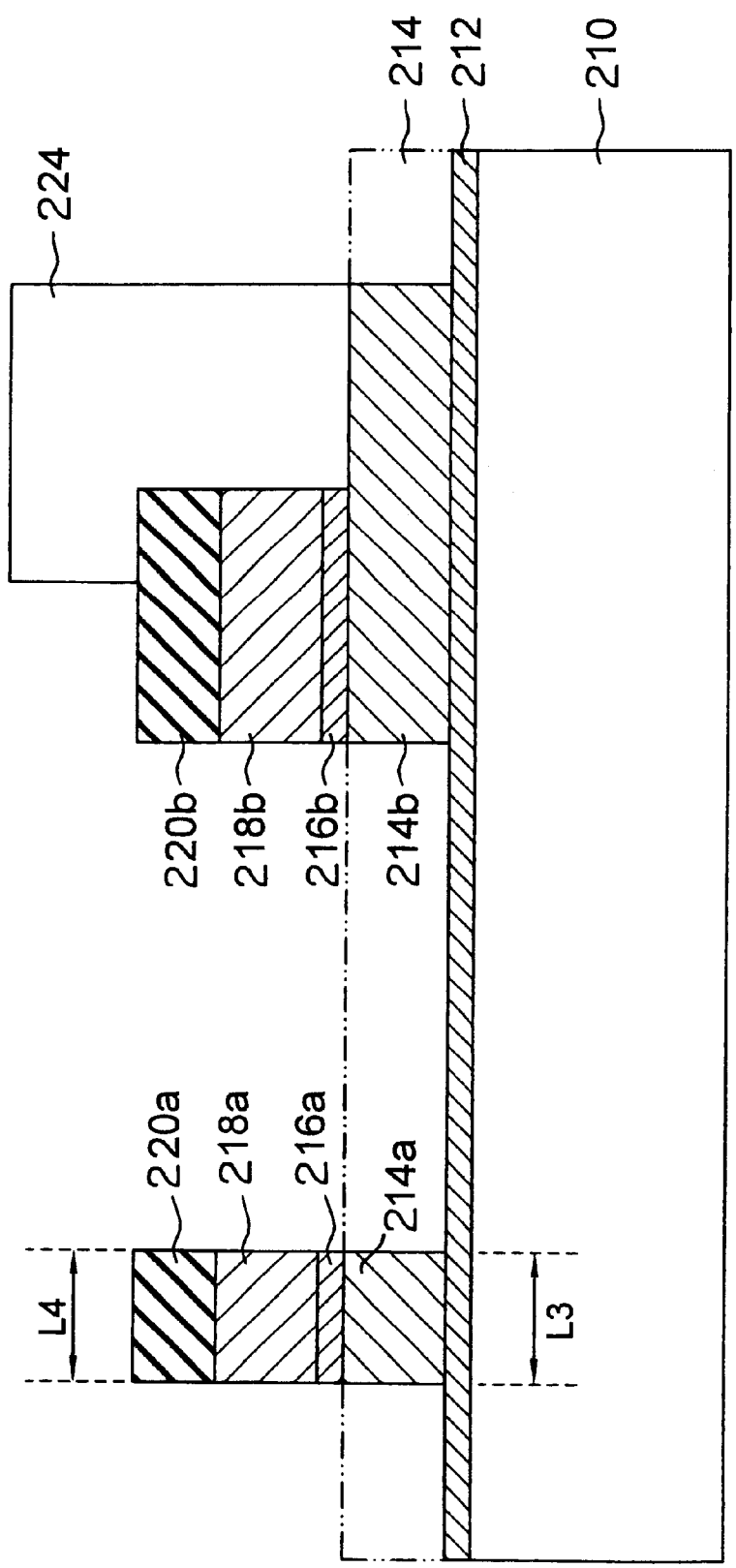
F I G. 13

METHOD FOR PRODUCING NONVOLATILE SEMICONDUCTOR MEMORY DEVICE

RELATED APPLICATION

This application claims benefit of priority under 35 U.S.C. §119 to Japanese Patent Application No. H11-67441, filed on Mar. 12, 1999, the entire contents of which are incorporated by reference herein.

BACKGROUND OF THE INVENTION

1. Field of the Invention

The present invention relates generally to a nonvolatile semiconductor memory device, and a method for producing the same. More specifically, the invention relates to a nonvolatile semiconductor memory device having a stacked gate type transistor, and a method for producing the same.

2. Description of the Related Background Art

A typical nonvolatile semiconductor memory device is provided with a cell transistor forming region for forming a cell transistor for nonvolatilisably accumulating charges, a selecting transistor forming region for forming a selecting transistor for selectively operating the cell transistor, and a peripheral transistor forming region for forming a peripheral transistor for the cell transistor and the selecting transistor.

The cell transistor has a two-layer structure which comprises a first polysilicon layer constituting a floating gate, and a second polysilicon layer constituting a control gate. Therefore, in order to flatten the surface of a nonvolatile semiconductor memory device, it is desired that the peripheral transistor and the selecting transistor have a two-layer structure. That is, it is desired that the height of the cell transistor in the cell transistor forming region is the same as the height of the selecting transistor in the selecting transistor forming region. Moreover, it is desired that the height of the cell transistor in the cell transistor forming region is the same as the height of the selecting transistor in the peripheral transistor forming region.

SUMMARY OF THE INVENTION

It is therefore an object of the present invention to eliminate the aforementioned problems and to provide a nonvolatile semiconductor memory device wherein the height of a cell transistor in a cell transistor forming region is the same as the height of a selecting transistor in a selecting transistor forming region.

It is another object of the present invention to provide a nonvolatile semiconductor memory device wherein the height of a cell transistor in a cell transistor forming region is the same as the height of a peripheral transistor in a peripheral transistor forming region.

It is a further object of the present invention to provide a nonvolatile semiconductor memory device wherein the surface of an interlayer insulator film is flattened when the interlayer insulator film is formed on a semiconductor transistor, a selecting transistor and a peripheral transistor.

In order to accomplish the aforementioned and other objects, according to one aspect of the present invention, there is provided a method for producing a nonvolatile semiconductor memory device which has a cell transistor forming region, in which a cell transistor is formed, and a non-cell transistor forming region, in which at least one of a peripheral transistor and a selecting transistor is formed, the method comprising the steps of: forming a first insulator film on a semiconductor substrate; forming a first conductive film on the first insulator film; forming a second insulator film on the first conductive film; forming a second conductive film on the second insulator film; forming a mask film on the second conductive film; patterning the mask film to form a cell mask film in the cell transistor forming region, and a transistor mask film in the non-cell transistor forming region; etching the second conductive film using the cell mask film and the transistor mask film as masks to form a control gate in the cell transistor forming region, and a second gate electrode in the non-cell transistor forming region; etching the second insulator film using the cell mask film and the transistor mask film as masks to form an intergate insulator film in the cell transistor forming region and the non-cell transistor forming region; forming a resist pattern in the non-cell transistor forming region so that a part of the resist pattern overlaps with the transistor mask film; and etching the first conductive film using the cell mask film, the transistor mask film and the resist pattern as masks to form a floating gate in the cell transistor forming region, and a first gate electrode in the non-cell transistor forming region.

According to another aspect of the present invention, there is provided a method for producing a nonvolatile semiconductor memory device comprising: a cell transistor which is formed on a semiconductor substrate and which has a cell insulator film, a floating gate, a first intergate insulator film, a control gate and a cell mask film; and a transistor which is formed on the semiconductor substrate and which has a transistor insulator film, a first gate electrode, a second intergate insulator film, a second gate electrode and a transistor mask film, the method comprising the steps of: sequentially forming a first insulator film, a first conductive film, a second insulator film, a second conductive film and a mask film on a semiconductor substrate; patterning the mask film to form the cell mask film and the transistor mask film; etching the second conductive film and the second insulator film using the cell mask film and the transistor mask film as masks to form the control gate and the second gate electrode and to form the first intergate insulator film and the second intergate insulator film; forming a resist pattern so that a part of the resist pattern overlaps with the transistor mask film; and etching the first conductive film using the cell mask film, the transistor mask film and the resist pattern as masks to form the floating gate and the first gate electrode.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 3 is a sectional view showing a part of a process for producing the first preferred embodiment of a nonvolatile semiconductor memory device according to the present invention;

FIG. 5 is a sectional view sowing a part of a process for producing the first preferred embodiment of a nonvolatile semiconductor memory device according to the present invention;

FIG. 13 is a sectional view showing a part of a process for producing the second preferred embodiment of a nonvolatile semiconductor memory device according to the present invention;

DESCRIPTION OF THE PREFERRED EMBODIMENT (First Preferred Embodiment)

Referring now to the accompanying drawings, particularly to FIGS. 1 through 8, the art as a premise of the present invention will be described below.

FIGS. 1 through 8 show the art which is personally known by the inventor and which is not publicly known.

Figure 6:
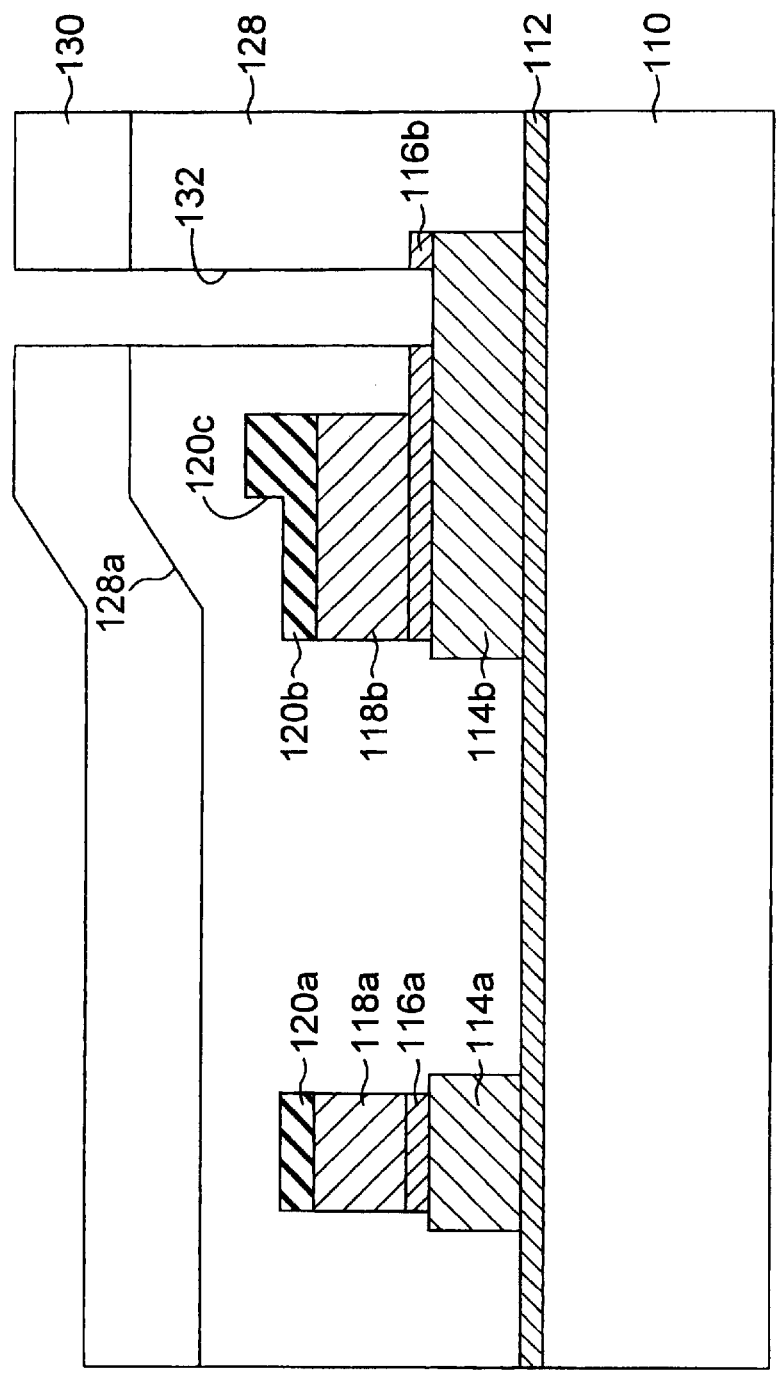
FIG. 6 is a sectional view showing a part of a process for producing the first preferred embodiment of a nonvolatile semiconductor memory device according to the present invention.
Figure 7:
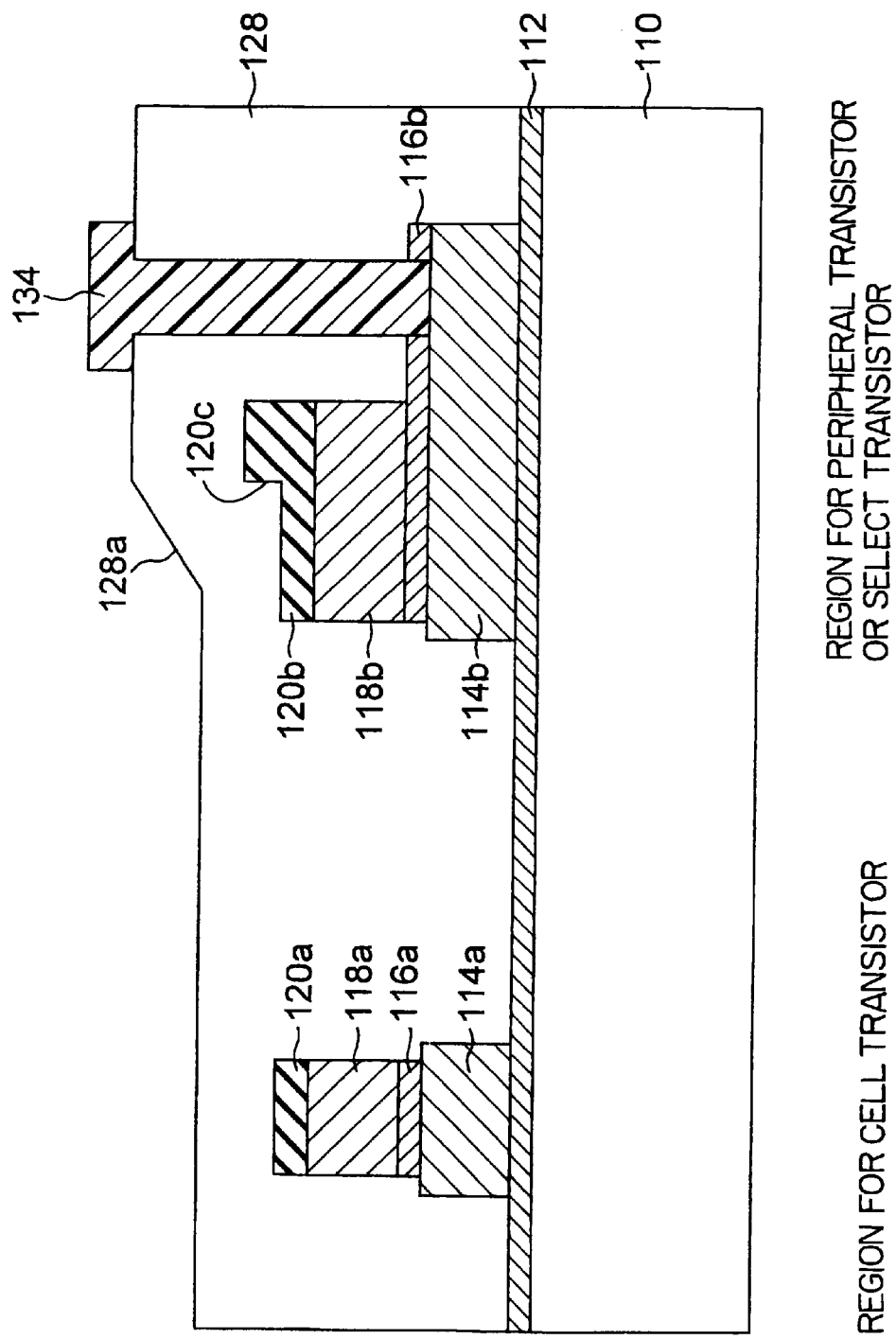
FIG. 7 is a sectional view of the first preferred embodiment of a nonvolatile semiconductor memory device according to the present invention.
Figure 8:
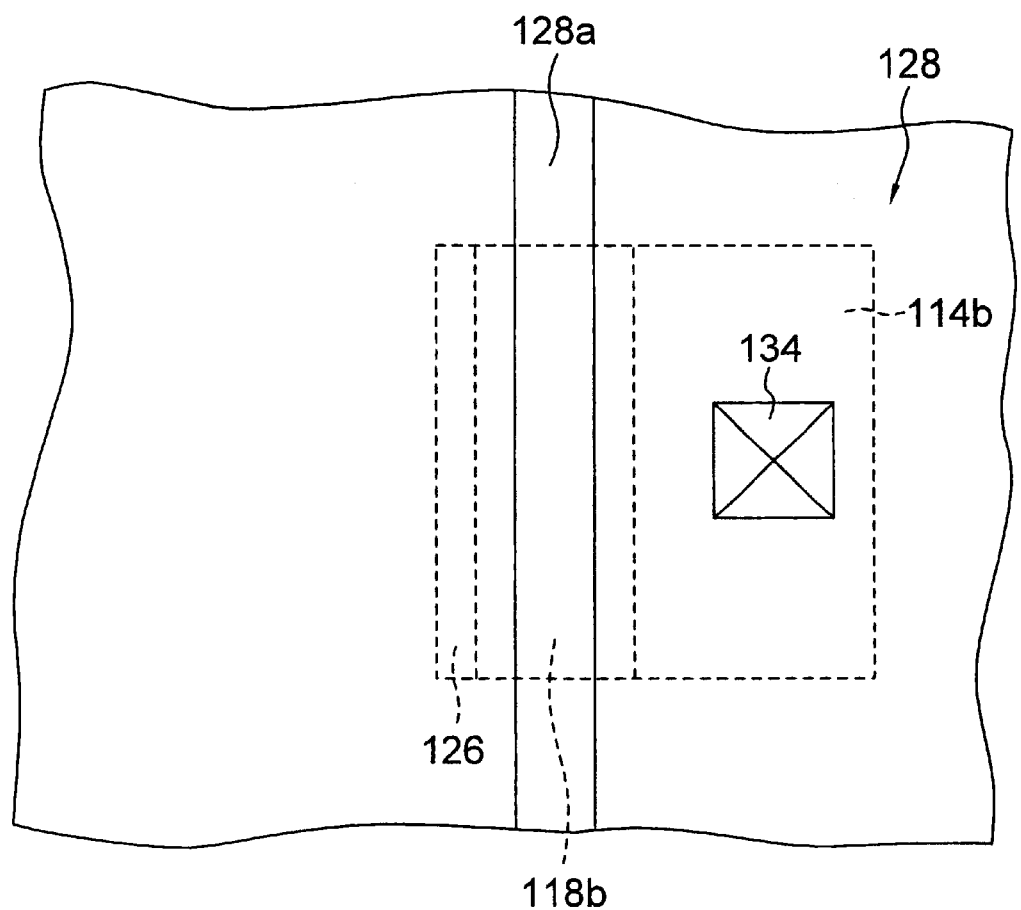
FIG. 8 is a plan view of the nonvolatile semiconductor memory device of FIG. 7, which is viewed from the top.

FIGS. 1 through 7 are sectional views showing a process for producing the first preferred embodiment of a nonvolatile semiconductor memory device according to the present invention, and FIG. 8 is a plan view which is viewed from the top in FIG. 7. In FIGS. 1 through 7, a cell transistor forming region is shown on the left side, and a peripheral transistor forming region and/or a selecting transistor forming region is shown on the right side.

Figure 1:
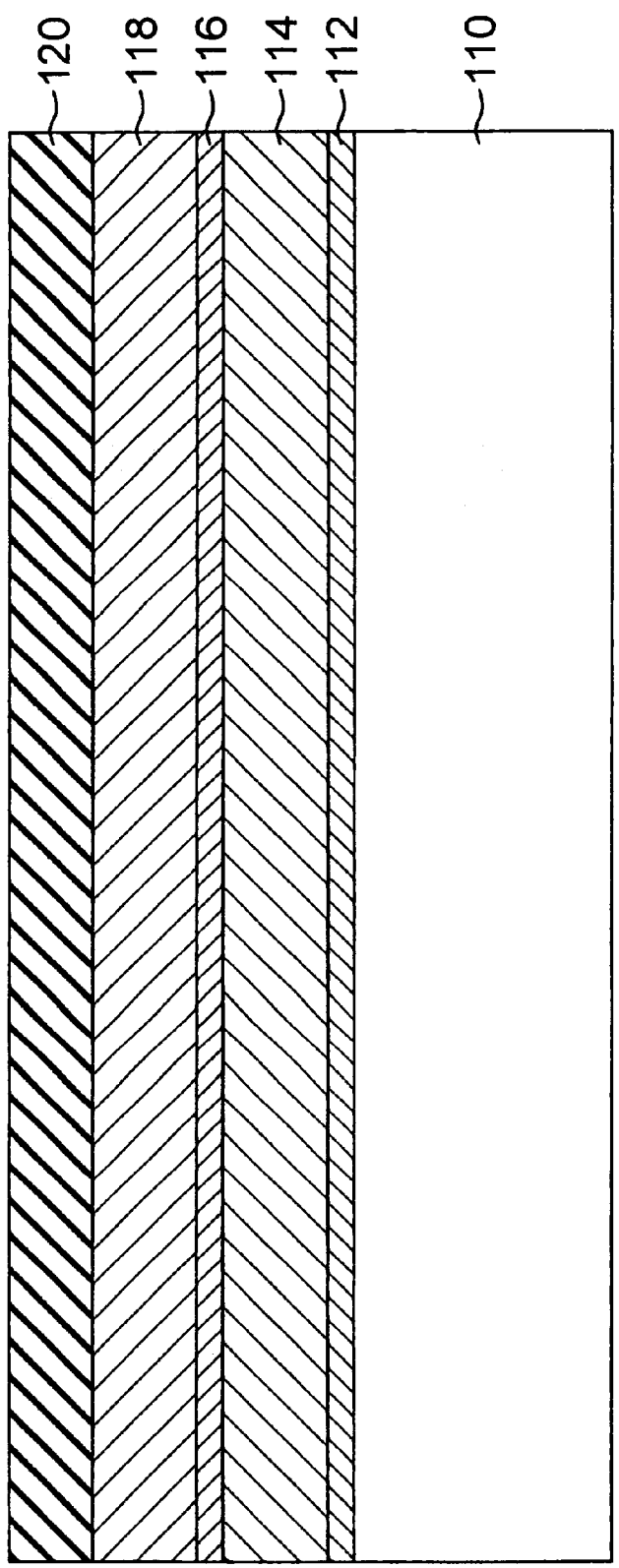
FIG. 1 is a sectional view showing a part of a process for producing the first preferred embodiment of a nonvolatile semiconductor memory device according to the present invention.

First, as shown in FIG. 1, a gate oxide film 112 is formed on a semiconductor substrate 110 of a silicon substrate by the thermal oxidation or the like. Subsequently, a first polysilicon layer 114 having a desired value of resistance is formed on the gate oxide film 112 by the chemical vapor deposition (CVD) or the like.

Then, an oxide-nitride-oxide (ONO) insulator film 116 is formed on the first polysilicon layer 114. For example, the formation of the ONO insulator film 116 is carried out by forming a lower oxide film by the thermal oxidation, forming a nitride film by the low pressure CVD (LP-CVD), and forming an upper oxide film by the thermal oxidation. Subsequently, a second polysilicon layer 118 having a desired value of resistance is formed on the ONO insulator film 316 by the CVD or the like. Subsequently, a mask insulator film 120 of an oxide or nitride film is formed on the second polysilicon layer 118 by the CVD or the like.

Figure 2:
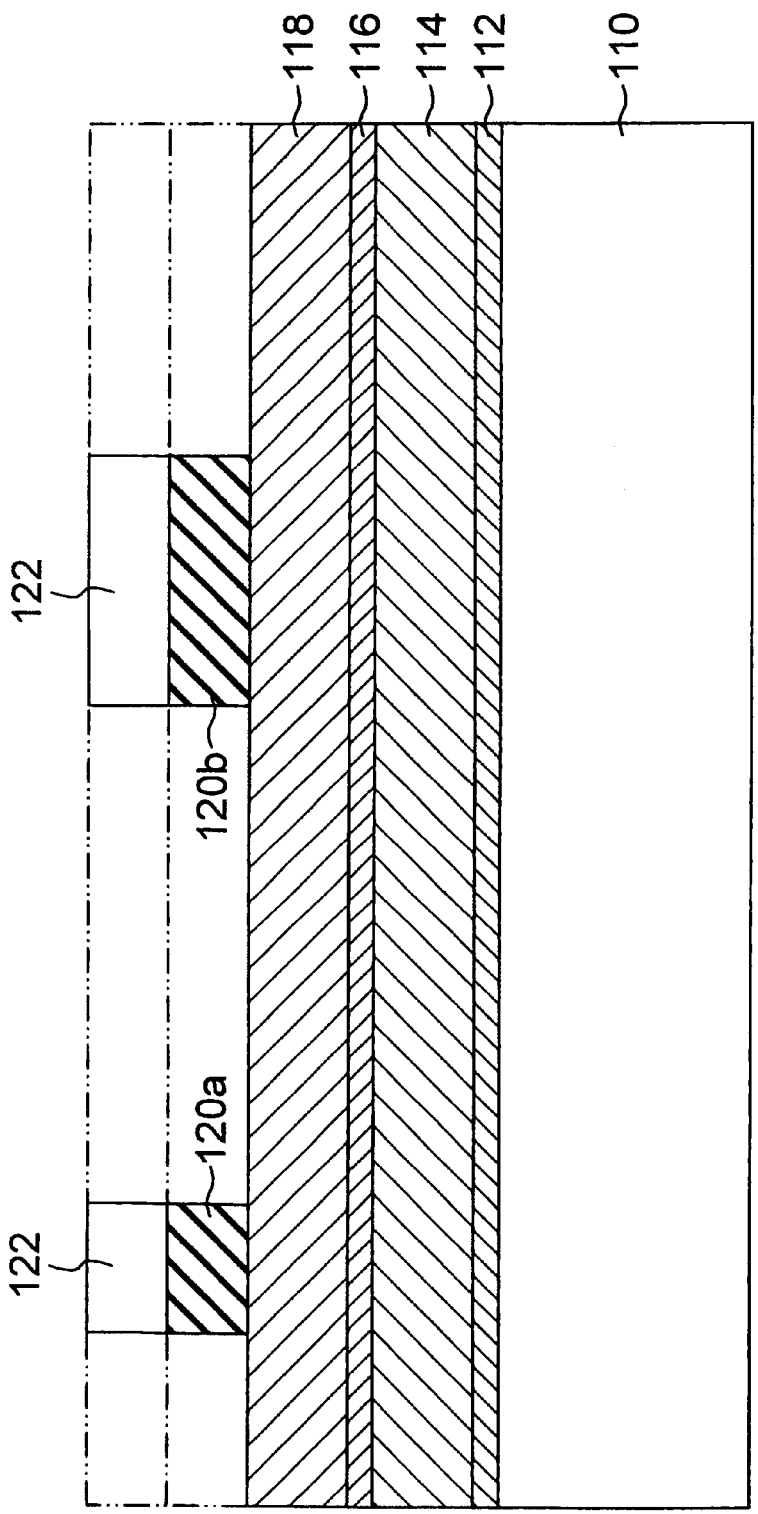
FIG. 2 is a sectional view showing a part of a process for producing the first preferred embodiment of a nonvolatile semiconductor memory device according to the present invention.

Then, as shown in FIG. 2, a resist is applied on the mask insulator film 120 and patterned by the photo lithography to form a resist pattern 122. Subsequently, the mask insulator film 120 is patterned by the reactive ion etching (RIE) using the resist pattern 122 as a mask. Thus, mask insulator films 120a and 120b are formed.

Then, as shown in FIG. 3, the resist pattern 122 is removed. Subsequently, the second polysilicon layer 118 is patterned by the RIE or the like using the mask insulator films 120a and 120b as masks to form a control gate 118a and a second gate electrode 118b. Subsequently, a resist is applied thereon and patterned by the photo lithography to form a resist pattern 124. That is, the resist pattern 124 for forming a first gate electrode is formed in a peripheral transistor forming region and/or a selecting transistor forming region. The resist pattern 124 is designed so as to cover a part of the mask insulator film 120b taking account of a mating margin.

Figure 4:
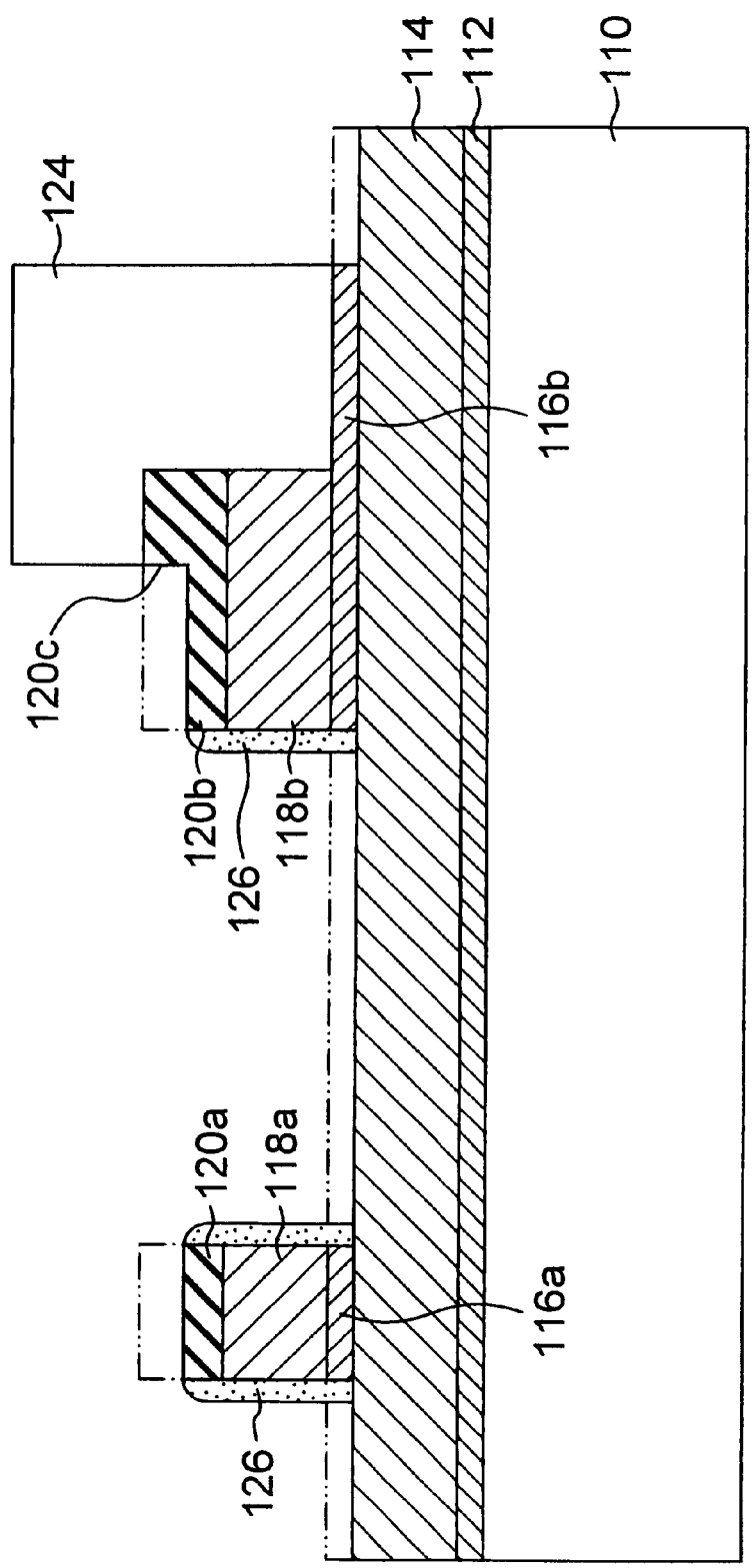
FIG. 4 is a sectional view showing a part of a process for producing the first preferred embodiment of a nonvolatile semiconductor memory device according to the present invention.

Then, as shown in FIG. 4, the ONO insulator film 116 is etched by the RIE or the like using the resist pattern 124 as a mask. By this etching, intergate insulator films 116a and 116b are formed. During the etching, part of the mask insulator films 120a and 120b are also etched since the materials thereof are similar to the material of the ONO insulator film 116. That is, the mask insulator film 120a in a cell transistor forming region is etched as a whole, so that the thickness thereof decreases. On the other hand, the mask insulator film in the peripheral transistor forming region and/or the selecting transistor region is partially etched due to the presence of the resist 124, so that a difference 120c in level is formed.

When the ONO insulator film 116 is etched, deposits 126 are formed on the side walls of the mask insulator films 120a and 120b, the side walls of the control gate 118a and second gate electrode 118b, and the side walls of the intergate insulator films 116a and 116b. The deposits 126 can be removed by the ashing and wet treatment. However, if such treatments are carried out, the resist pattern 124 is also removed, so that the deposits 126 can not be removed at this time. In addition, the resist pattern 124 can not be removed at this time since the resist pattern 124 is necessary for the etching of the first polysilicon layer 114 as described below. Therefore, in this state, the next treatment is carried out.

That is, as shown in FIG. 5, the first polysilicon layer 114 is etched by the RIE or the like to form a floating gate 114a and a first gate electrode 114b. At this time, the deposits 126 also serve as masks, so that the width of the floating gate 114a is greater than the width of the control gate 118a.

Then, as shown in FIG. 6, the resist pattern 124 is removed At this time, the deposits 126 are also removed. Subsequently, an interlayer insulator film 128 is formed thereon. On the interlayer insulator film 128, a difference 128a in level is formed above the mask insulator film 120b. Subsequently, a resist is applied on the interlayer insulator film 128 and patterned by the photo lithography to form a resist pattern 130. Then, the interlayer insulator film 128 and the intergate insulator film 116b are etched by the RIE or the like using the resist pattern 130. By this etching, a contact hole 132 is formed.

Then, as shown in FIG. 7, the resist pattern 130 is removed. Subsequently, a third polysilicon layer having a desired value of resistance is formed to be embedded in the contact hole 132 and patterned to form a contact portion 134. As shown in FIG. 8 which is viewed from the top of FIG. 7, a difference 128a in level is formed on the second gate electrode 118b in the interlayer insulator film 128.

As can be seen from the foregoing, according to the nonvolatile semiconductor memory device in the first preferred embodiment, the peripheral transistor and/or selecting transistor comprises the first gate electrode 114b formed of the first polysilicon layer 114, and the second gate electrode 118b formed of the second polysilicon layer 118 similar to the cell transistor. Therefore, the surface of the nonvolatile semiconductor memory device can be flatter than that when the peripheral transistor and/or selecting transistor is not provided with the second gate electrode 118b.

However, in the above described process for producing the nonvolatile semiconductor memory device, there are the following problems.

First, as shown in FIG. 4, there is a problem in that the deposits 126 are formed. That is, there is a problem in that the deposits 126 are formed on the side walls of the mask insulator films 120a and 120b, the side walls of the control gate 118a and second gate electrode 118b and the side walls of the intergate insulator films 116a and 116b when the ONO insulator film 116 is etched. If the deposits 126 are thus formed, the deposits 126 serve as masks, so that there is a problem in that the width(length) L1 of the floating gate 114a is longer than the width(length) L2 of the control gate 118a as shown in FIG. 5. That is, there is a problem in that the gate dimension increases.

Moreover, the degree of adhesion of the deposits 126 is not always constant. Therefore, there is a problem in that the sizes of the floating gate 114a and first gate electrode 114b vary in accordance with the degree of adhesion of the deposits 126.

Secondly, as shown in FIG. 4, there is a problem in that the difference 120c in level is formed in the mask insulator film 120b. If such a difference 120c in level exists, there is a problem in that the difference 128a in level is formed as shown in FIG. 7 when the interlayer insulator film 128 is formed. If such a difference 128a in level exists, there is a problem in that it is difficult to align the mask for the photo lithography when the contact hole 132 is formed in the interlayer insulator film 128 as shown in FIG. 6. In addition, since light is scattered on a portion having the difference 128 in level during the lithography, the margin of focus decreases, so that there is a problem in that the resist mask can not be patterned with required precision.

Thirdly, since the resist pattern 124 is formed on the ONO insulator film 116 as shown in FIG. 3, there is a problem in that adhesion between both is bad. Therefore, there is a problem in that the resist pattern 124 is peeled off and the resist flies off.

(Second Preferred Embodiment)

In order to eliminate the above described problems in the first preferred embodiment, the second preferred embodiment of the present invention has been made. In the second preferred embodiment, it is an object to provide a method for producing a nonvolatile semiconductor memory device, which can move deposits 126 formed on the side walls of mask insulator films 120a and 120b, the side walls of a control gate 118a and second gate electrode 118b, and the side walls of intergate insulator films 116a and 116b when an ONO insulator film 116 is etched, and a nonvolatile semiconductor memory device produced by this method. It is another object to provide a nonvolatile semiconductor memory device wherein an interlayer insulator film 128 has no difference in level, and a method for producing the same. It is a further object to provide a method for producing a nonvolatile semiconductor memory device wherein a resist pattern 124 is not peeled off and a resist does not fly off, and a nonvolatile semiconductor memory device produced by this method.

That is, in the second preferred embodiment after a second polysilicon layer and an ONO insulator film are etched using a mask insulator film, the photo lithography for leaving a first gate is carried out to form a resist mask in a peripheral transistor forming region and/or peripheral transistor forming region, and then, a first polysilicon layer is patterned using the resist mask and a mask insulator film as masks. Thus, the width of the first polysilicon layer and the width of the second polysilicon layer are matched with each other, so that it is prevent an interlayer insulator film from having a difference in level and it is possible to prevent a resist from flying off.

Figure 14:
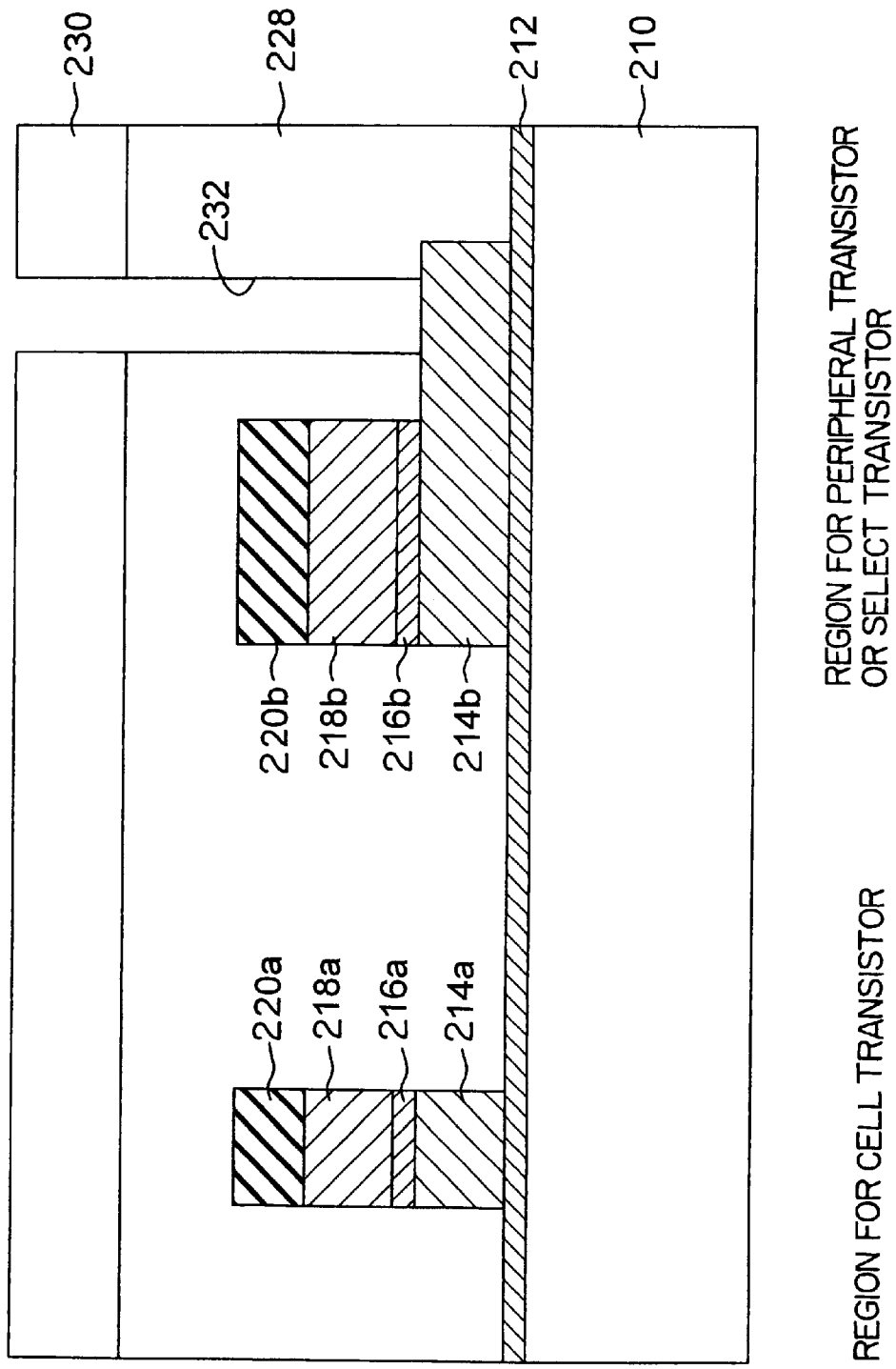
FIG. 14 is a sectional view showing a part of a process for producing the second preferred embodiment of a nonvolatile semiconductor memory device according to the present invention.
Figure 15:
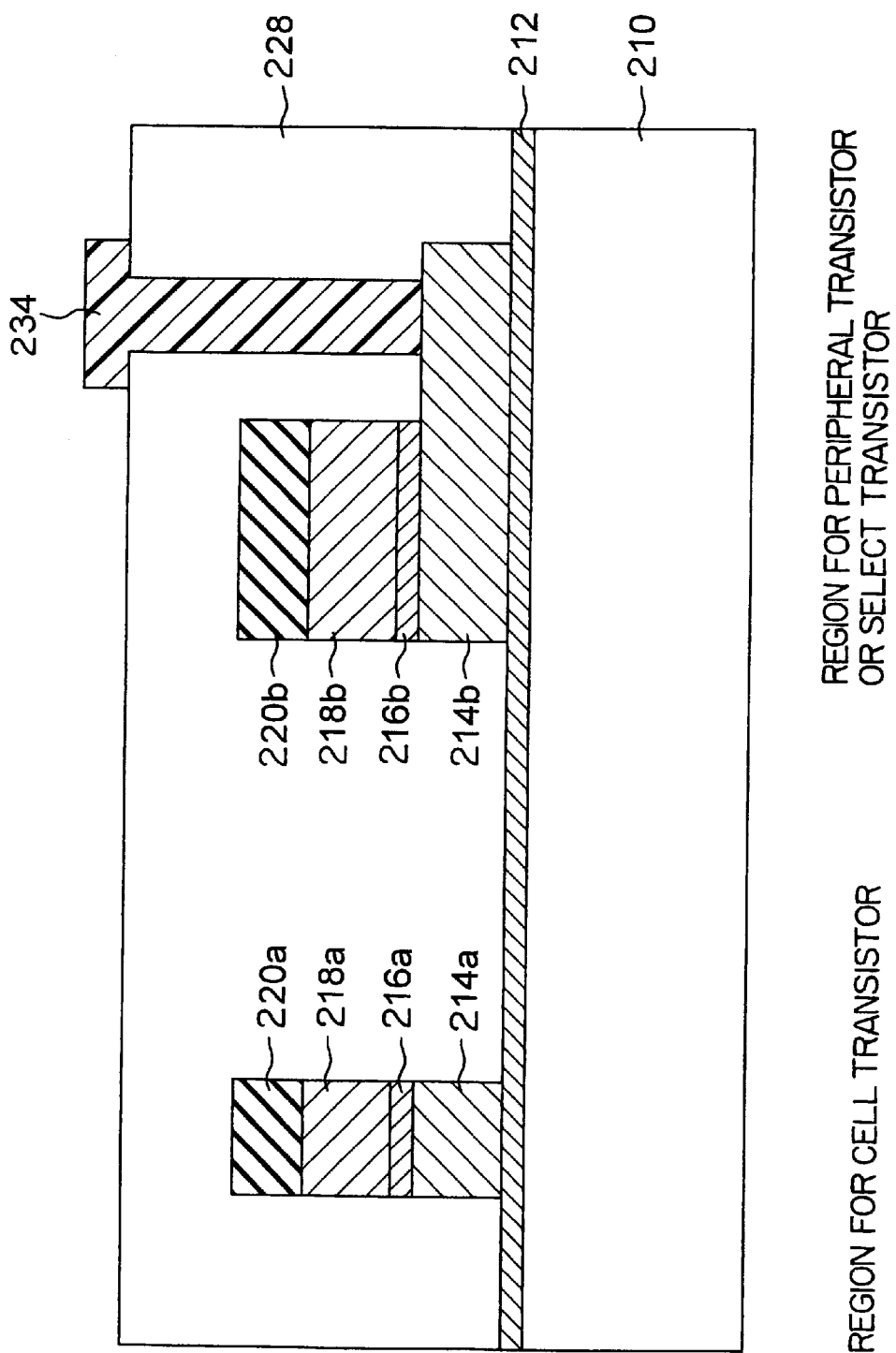
FIG. 15 is a sectional view of the second preferred embodiment of a nonvolatile semiconductor memory device according to the present invention.
Figure 16:
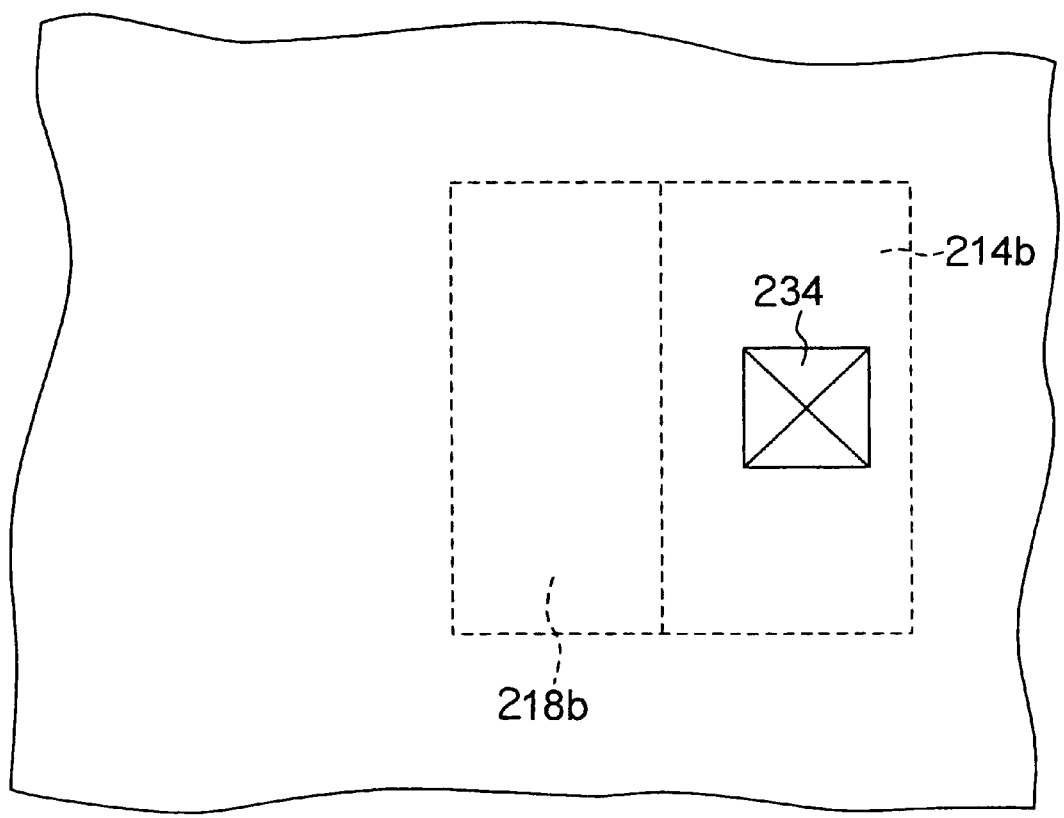
FIG. 16 is a plan view of the nonvolatile semiconductor memory device of FIG. 15, which is viewed from the top.

Referring to FIGS. 9 through 16, a process for producing the second preferred embodiment of a nonvolatile semiconductor memory device according to the present invention will be described below. FIGS. 9 through 15 are sectional views showing a process for producing the second preferred embodiment of a nonvolatile semiconductor memory device according to the present invention, and FIG. 16 is a plan view which is viewed from the top in FIG. 15. In FIGS. 9 through 15, a cell transistor forming region is shown on the left side, and a peripheral transistor forming region and/or a selecting transistor forming region is shown on the right side. The peripheral transistor forming region and/or the selecting transistor forming region are/is non-cell transistor forming regions in this preferred embodiment.

Figure 9:
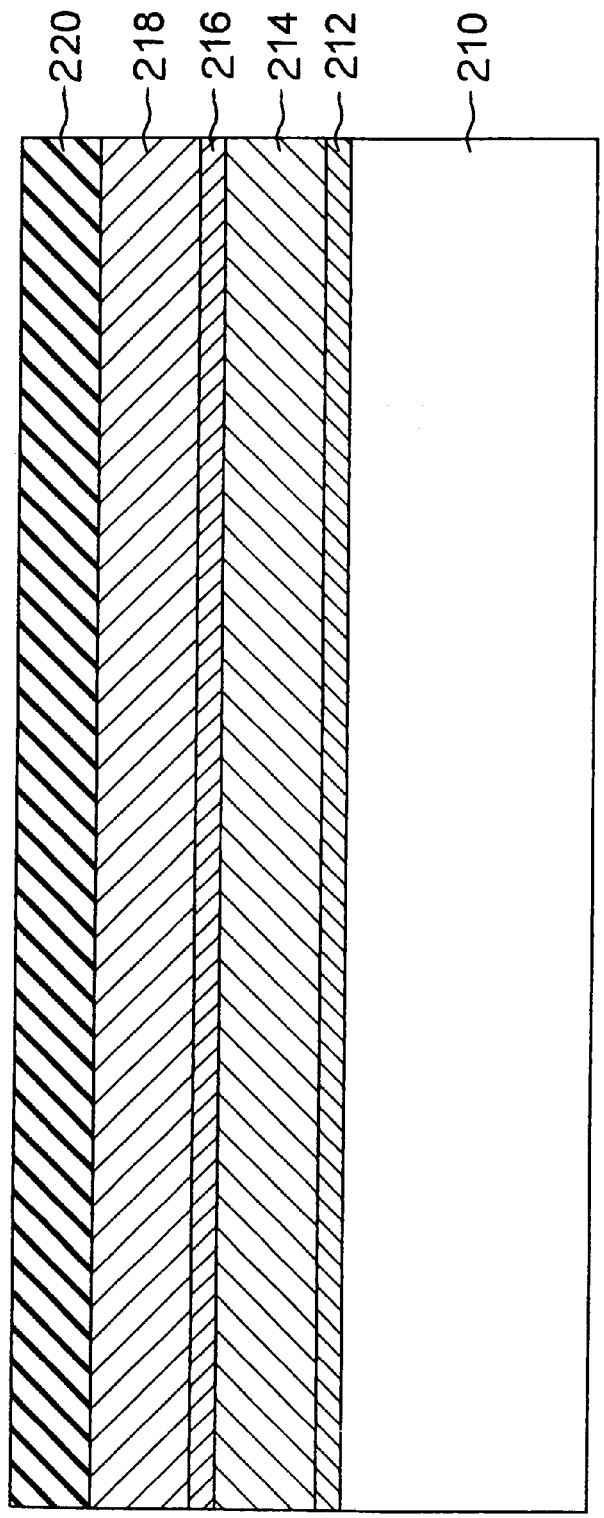
FIG. 9 is a sectional view showing a part of a process for producing the second preferred embodiment of a nonvolatile semiconductor memory device according to the present invention.

First, as shown in FIG. 9, a gate oxide film 212 is formed on a semiconductor substrate 210 of a silicon substrate by the thermal oxidation or the like. This gate insulator film constitutes a first insulator film in this preferred embodiment. Subsequently, a first polysilicon layer 214 having a desired value of resistance is formed on the gate oxide film 212 by the chemical vapor deposition (CVD) or the like. That is, the impurity doped first polysilicon layer 214 is formed.

Then, an oxide-nitride-oxide (ONO) insulator film 216 is formed on the first polysilicon layer 214. For example, the formation of the ONO insulator film 216 is carried out by forming a lower oxide film by the thermal oxidation, forming a nitride film by the low pressure CVD (LP-CVD), and forming an upper oxide film by the thermal oxidation. This ONO insulator film constitutes a second insulator film in this preferred embodiment. Subsequently, a second polysilicon layer 218 having a desired value of resistance is formed on the ONO insulator film 216 by the CVD or the like. That is, the impurity doped second polysilicon layer 218 is formed. Subsequently, a mask insulator film 220 of an oxide or nitride film is formed on the second polysilicon layer 218 by the CVD or the like. The mask insulator film 220 of the oxide film is, e.g., $SiO_2$ film, and the mask insulator film 220 of the nitride film is, e.g., $Si_3N_4$.

Figure 10:
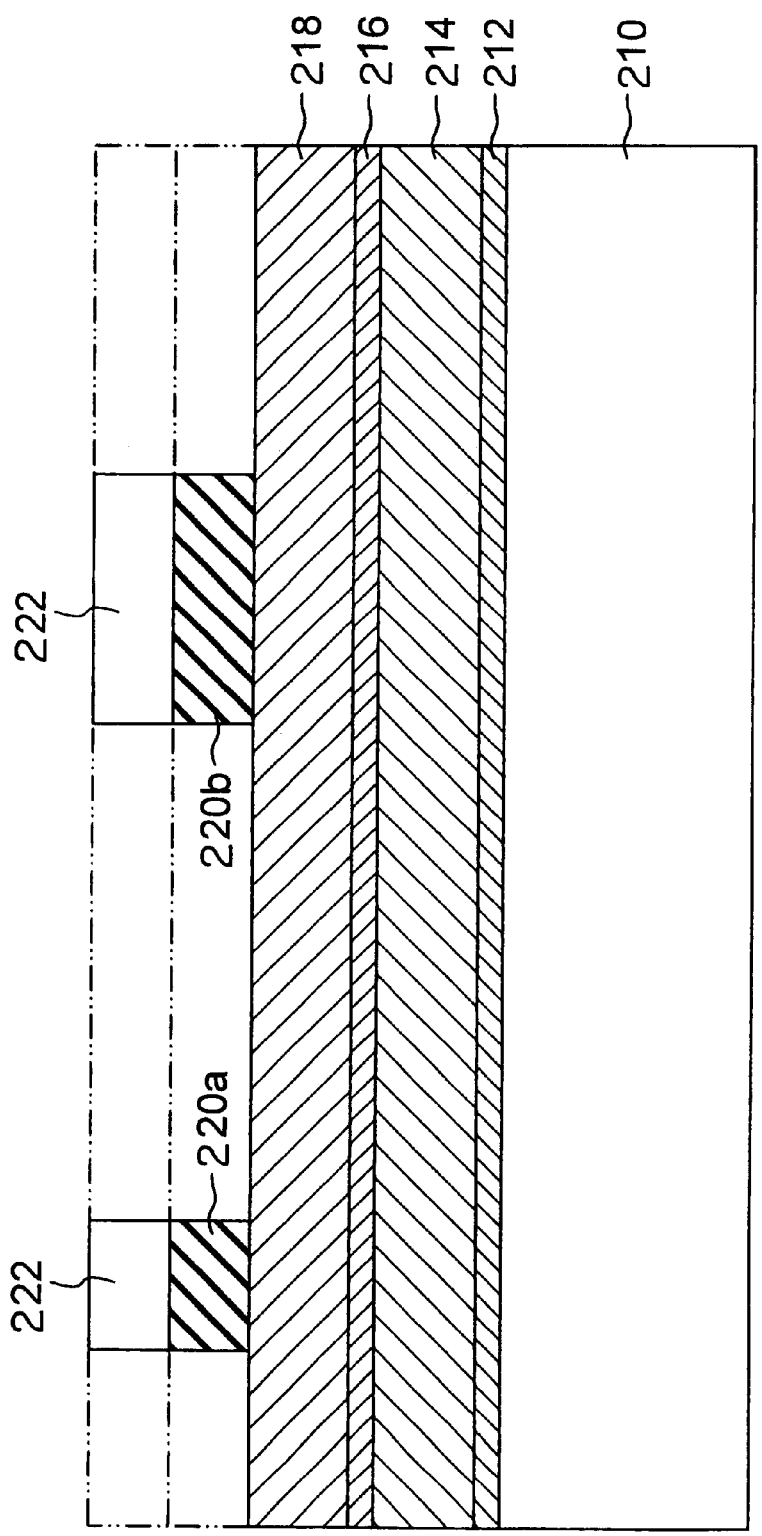
FIG. 10 is a sectional view showing a part of a process for producing the second preferred embodiment of a nonvolatile semiconductor memory device according to the present invention.

Then, as shown in FIG. 10, a resist is applied on the mask insulator film 220 and patterned by the photo lithography to form a resist pattern 222. Subsequently, the mask insulator film 220 is patterned by the reactive ion etching (RIE) using the resist pattern 222 as a mask. Thus, mask insulator films 220a and 220b are formed. The mask insulator film 220a constitutes a mask insulator film for a cell transistor in this preferred embodiment, and the mask insulator film 220b constitutes a mask insulator film for a second gate electrode in this preferred embodiment.

Figure 11:
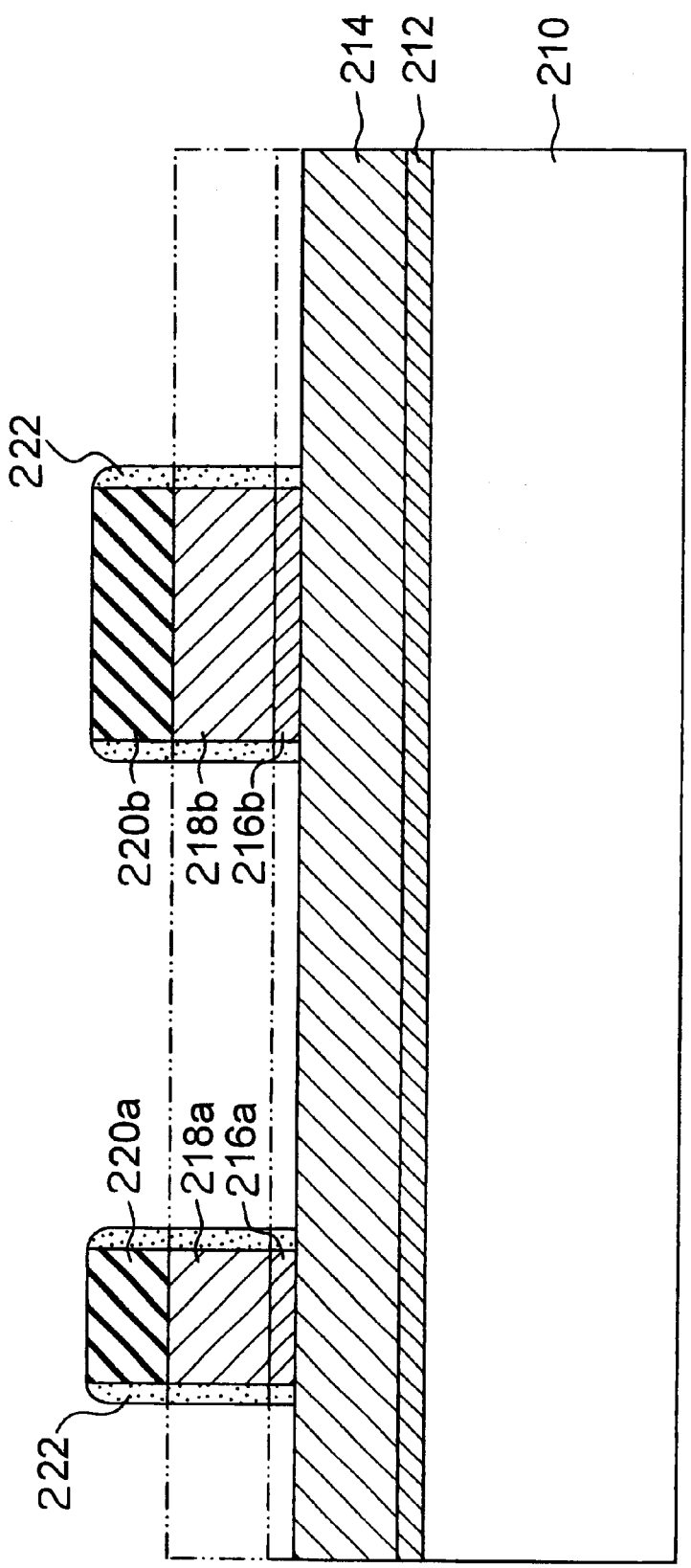
FIG. 11 is a sectional view showing a part of a process for producing the second preferred embodiment of a nonvolatile semiconductor memory device according to the present invention.

Then, as shown in FIG. 11, the resist pattern 222 is removed. Subsequently, the second polysilicon layer 218 is patterned by the RIE or the like using the mask insulator films 220a and 220b as masks to form a control gate 218a and a second gate electrode 218b. Moreover, the ONO insulator film 216 is patterned by the RIE or the like using the mask insulator films 220a and 220b as masks to form intergate insulator films 216a and 216b.

When the ONO insulator film 216 is etched, deposits 222 are formed on the side walls of the mask insulator films 220a and 220b, the side walls of the control gate 218a and second gate electrode 218b, and the side walls of the intergate insulator films 216a and 216b.

Figure 12:
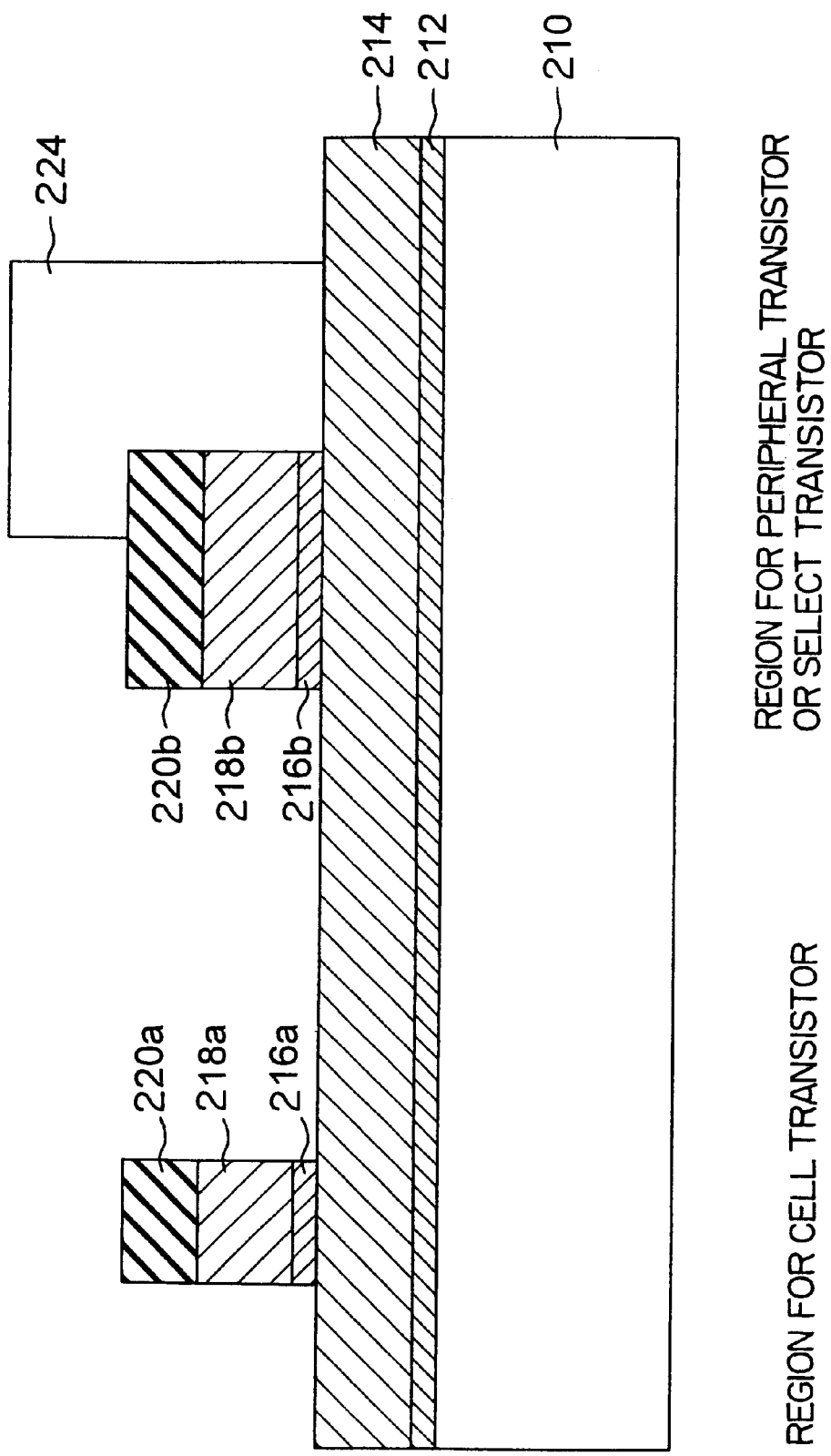
FIG. 12 is a sectional view showing a part of a process for producing the second preferred embodiment of a nonvolatile semiconductor memory device according to the present invention.

Then, as shown in FIG. 12, the deposits 222 are removed. That is, the deposits 222 are removed by the ashing and the wet treatment. At this time, a resist pattern 224 has not yet been formed, so that the ashing and the wet treatment can be carried out.

Subsequently, a resist is applied and patterned by the photo lithography to form a resist pattern 224. That is, a first gate electrode resist pattern for forming a first gate electrode is formed in a peripheral transistor forming region and/or selecting transistor forming region. The resist pattern 224 is designed so as to cover a part of the mask insulator film 220b taking account of a mating margin.

Then, as shown in FIG. 13, the first polysilicon layer 214 is etched by the RIE or the like using the resist pattern 224 and the mask insulator films 220a and 220b as masks. By this etching, a floating gate 214a and a first gate electrode 214b are formed. When the first polysilicon 214 is etched, the mask insulator film 220a and 220b are not etched since these films have a high selective etching ratio for the first polysilicon layer 214.

Then, as shown in FIG. 14, the resist pattern 224 is removed. Subsequently, an interlayer insulator film 228 is formed thereon. The surface of the interlayer insulator film 228 is formed so as to be flat. Subsequently, a resist is applied on the interlayer insulator film 228 and patterned by the photo lithography to form a resist pattern 230. Then, the interlayer insulator film 228 is etched by the RIE or the like using the resist pattern 230. By this etching, a contact hole 232 is formed.

Then, as shown in FIG. 15, the resist pattern 230 is removed. Subsequently, a third polysilicon layer of a conductive material having a desired value of resistance is formed to be embedded in the contact hole 232 and patterned to form a contact portion 234. As shown in FIG. 16 which is viewed from the top of FIG. 15, the surface of the interlayer insulator film 228 has no difference in level to be flattened.

As can be seen from the foregoing, according to a method for producing a nonvolatile semiconductor memory device in this preferred embodiment, the step of removing the deposits 222 can be carried out as shown in FIG. 11. That is, when the ONO insulator film 216 is etched, the deposits 222 adhere to the side walls of the mask insulator films 220a and 220b, the side walls of the control gate 218a and second gate electrode 218b, and the side walls of the intergate insulator films 216a and 216b. However, since the resist pattern 224 has not yet been formed at this time, the deposits 222 can be removed by the ashing and the wet treatment. Therefore, as shown in FIG. 13, the width L3 of the floating gate 214a can be matched with the width L4 of the control gate 218a. That is, it is possible to prevent the width of the intergate insulator films 216a and 216b from being different from the width of the floating gate 214a and first electrode 214. Moreover, by removing the deposits 222, it is possible to eliminate the problem in that the sizes of the floating gate 214a and first gate electrode 214b vary.

In addition, as shown in FIG. 15, the mask insulator film 220b has no difference in level, so that the flatness of the surface of the interlayer insulator film 228 can be ensured. If the surface of the interlayer insulator film 228 is thus flattened, it is possible to eliminate the problem in that it is difficult to align the mask for the photo lithography when the contact hole 232 is formed in the interlayer insulator film 228 as shown in FIG. 14. In addition, it is possible to prevent light from being scattered during lithography, and it is possible to ensure the margin of focus, so that it is possible to pattern the resist mask with required precision.

Moreover, since the resist pattern 224 is formed on the first polysilicon layer 214 as shown in FIG. 12, adhesion between both is good. That is, it is possible to form the resist on the polysilicon having better adhesion than that of the ONO insulator film. Therefore, it is possible to eliminate the problem in that the resist pattern 224 is peeled off and the resist flies off.

Furthermore, the present invention should not be limited to the above described preferred embodiments, and the invention may be modified in various ways. For example, in the above described preferred embodiment, the floating gate 214a has been formed of a polysilicon, the intergate insulator film 216a has been formed of an ONO film, and the mask insulator film 220a has been formed of a nitride or oxide system film. However, the present invention should not be limited to this combination. For example, the floating gate 214a maybe formed of amorphous silicon, the intergate insulator film 216a may be formed of a monolayer oxide film, NO film, high dielectric film or the like, and the mask insulator film may be a film having a high selective etching ratio with polysilicon, such as a laminated film of nitride and oxide films or carbon.

In addition, while the deposits 222 have been removed in the above described preferred embodiment as shown in FIGS. 11 and 12, it is not always required to carry out this treatment. That is, it is possible to flatten the surface of the interlayer insulator film 228 without the need of the removal of the deposits 222.

As described above, according to the present invention, it is possible to provide a method for producing a nonvolatile semiconductor memory device wherein the surface of an interlayer insulator film is flattened and wherein the resist pattern is not peeled off and does not fly off, and a nonvolatile semiconductor memory device produced by this method.

What is claimed is:

1. A method for producing a nonvolatile semiconductor memory device which has a cell transistor forming region, in which a cell transistor is formed, and a non-cell transistor forming region, in which at least one of a peripheral transistor and a selecting transistor is formed, said method comprising:

forming a first insulator film on a semiconductor substrate;

forming a first conductive film on said first insulator film;

forming a second insulator film on said first conductive film;

forming a second conductive film on said second insulator film;

forming a mask film on said second conductive film;

patterning said mask film to form a cell mask film in said cell transistor forming region, and a transistor mask film in said non-cell transistor forming region;

etching said second conductive film using said cell mask film and said transistor mask film as masks to form a control gate in said cell transistor forming region, and a second gate electrode in said non-cell transistor forming region;

etching said second insulator film using said cell mask film and said transistor mask film as masks to form an intergate insulator film in said cell transistor forming region and said non-cell transistor forming region;

forming a resist pattern in said non-cell transistor forming region so that a part of said resist pattern overlaps with said transistor mask film; and etching said first conductive film using said cell mask film, said transistor mask film and resist pattern as masks to form a floating gate in said cell transistor forming region, and a first gate electrode in said non-cell transistor forming region.

2. A method for producing a nonvolatile semiconductor memory device as set forth in claim 1, which further comprises the step of removing a deposit, which is formed on said cell transistor forming region and said non-cell transistor forming region during forming said intergate insulator film, after forming said intergate insulator film.

3. A method for producing a nonvolatile semiconductor memory device as set forth in claim 2, which further comprises the steps of:

forming an interlayer insulator film on said semiconductor substrate after forming said floating gate and said first gate electrode;

forming a contact hole, which reaches said first gate electrode, in said interlayer insulator film; and embedding a conductive material in said contact hole to form a contact portion.

4. A method for producing a nonvolatile semiconductor memory device as set forth in claim 3, wherein said cell mask film and said transistor mask film have a high selective etching ratio for said first conductive film in said step of etching said first conductive film to form said floating gate and said first gate electrode.

5. A method for producing a nonvolatile semiconductor memory device as set forth in claim 3, wherein said first conductive film is an impurity doped polysilicon, and said mask film is an oxide insulator film or a nitride insulator film.

6. A method for producing a nonvolatile semiconductor memory device as set forth in claim 5, wherein said second conductive film is an impurity doped polysilicon, and said second insulator film is an laminated film formed of an oxide film, a nitride film and oxide film.

7. A method for producing a nonvolatile semiconductor memory device as set forth in claim 1, wherein the width of said floating gate is substantially the same as that of said control gate.

8. A method for producing a nonvolatile semiconductor memory device as set forth in claim 1, wherein said transistor mask film has no difference in level due to etching.

* * * * *